United States Patent [19]

Liu

[11] Patent Number: 5,873,983
[45] Date of Patent: Feb. 23, 1999

[54] METHOD FOR MINIMIZING SUBSTRATE TO CLAMP STICKING DURING THERMAL PROCESSING OF THERMALLY FLOWABLE LAYERS

[75] Inventor: David Liu, Taipei, Taiwan

[73] Assignee: Vanguard International Semiconductor Corporation, Hsin-Chu, Taiwan

[21] Appl. No.: 782,703

[22] Filed: Jan. 13, 1997

[51] Int. Cl.⁶ .................................................. C23C 14/34
[52] U.S. Cl. ............................... 204/192.15; 204/192.12; 204/192.3; 204/298.15
[58] Field of Search ................ 204/192.12, 192.15, 204/192.3, 298.15

[56] References Cited

U.S. PATENT DOCUMENTS

| 4,486,289 | 12/1984 | Parsons et al. | 204/298 |
|---|---|---|---|
| 4,522,697 | 6/1985 | Dimock et al. | 204/298 |
| 4,523,985 | 6/1985 | Dimock | 204/298 |
| 4,836,905 | 6/1989 | Davis et al. | 204/298 |
| 5,071,791 | 12/1991 | Inoue et al. | 204/192.15 X |
| 5,092,978 | 3/1992 | Kojima et al. | 204/298.15 |
| 5,108,570 | 4/1992 | Wang | 204/192.15 X |
| 5,358,616 | 10/1994 | Ward | 204/192.15 X |
| 5,439,574 | 8/1995 | Kobayashi et al. | 204/298.15 X |
| 5,512,155 | 4/1996 | Fukasawa | 204/298.15 X |
| 5,514,259 | 5/1996 | Shiota et al. | 204/298.15 X |
| 5,556,472 | 9/1996 | Nakamura et al. | 204/298.15 X |
| 5,639,357 | 6/1997 | Xu | 204/192.15 X |
| 5,674,366 | 10/1997 | Hayashi et al. | 204/298.15 X |

FOREIGN PATENT DOCUMENTS

| 1240647 | 9/1989 | Japan | 204/298.15 |
|---|---|---|---|
| 5254985 | 10/1993 | Japan | 204/298.15 |

OTHER PUBLICATIONS

S.Wolf et al, "Silicon Processing for the VLSI Era–vol. 1", Lattice Press, Sunset Beach, CA, 1986, pp. 359–363.

Ono et al, "Development of a Planarized Al–Si Contact Filing Technology", 1990 Vmic Conf Proceedings (Jun. 12–13, 1990) pp. 76–82.

Chen et al, "Planarized Aluminum Metallization for Sub–O–Sum CMOS Technology" IEEE IEDM 90, pp. 90–51 to 90–53.

Park et al. "Al–PLAPH (A Luminum Planarization by Post Heating) Process for Planarized Double Metal CMOS Applications".

1991 VMIC Conf. Proceedings (Jun. 11–12, 1991) pp. 326–328.

*Primary Examiner*—Nam Nguyen
*Assistant Examiner*—Steven H. Ver Steeg
*Attorney, Agent, or Firm*—George O. Saile; Stephen B. Ackerman; Alek P. Szeczy

[57] ABSTRACT

A method for forming and thermally processing upon a substrate a low melting temperature metal containing conductor layer. There is first provided a substrate. The substrate is fixtured within a clamp comprised of a backing member and a top member connected through a mechanical means to the backing member. A portion of the top member overlaps the substrate and leaves exposed a first portion of the substrate when the substrate is clamped between the backing member and the top member. There is then formed upon the first portion of the substrate a low melting temperature metal containing conductor layer while simultaneously forming upon the top member of the clamp a low melting temperature metal containing conductor layer residue. Finally, there is processing thermally the low melting temperature metal containing conductor layer and the low melting temperature metal containing conductor layer residue while positioning the substrate and the clamp in a substantially face down position. Through the method, a thermally processed low melting temperature metal containing conductor layer residue formed from the low melting temperature metal containing conductor layer residue will not flow and bridge with a thermally processed low melting temperature metal containing conductor layer formed from the low melting temperature metal containing conductor layer.

6 Claims, 3 Drawing Sheets

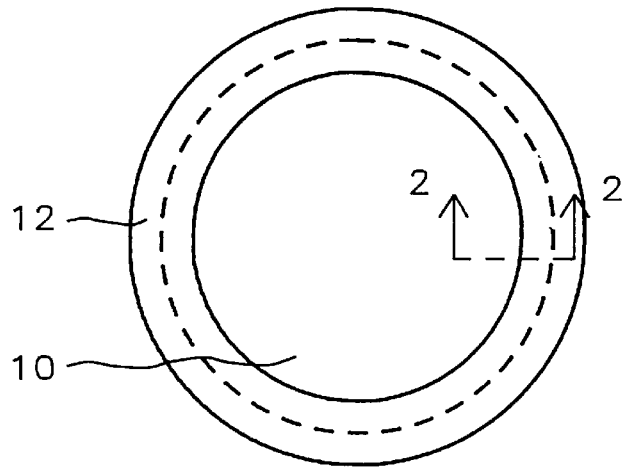
FIG. 1 – Prior Art
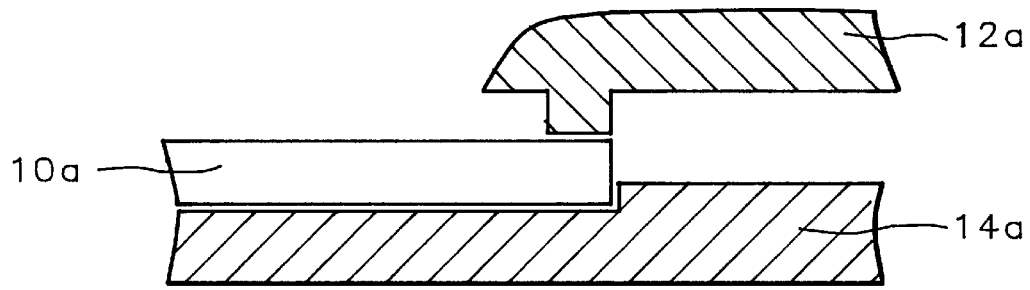
FIG. 2 – Prior Art
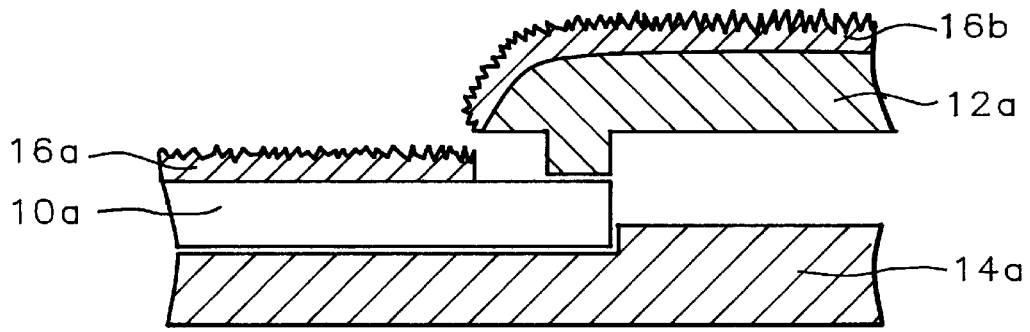
FIG. 3 – Prior Art

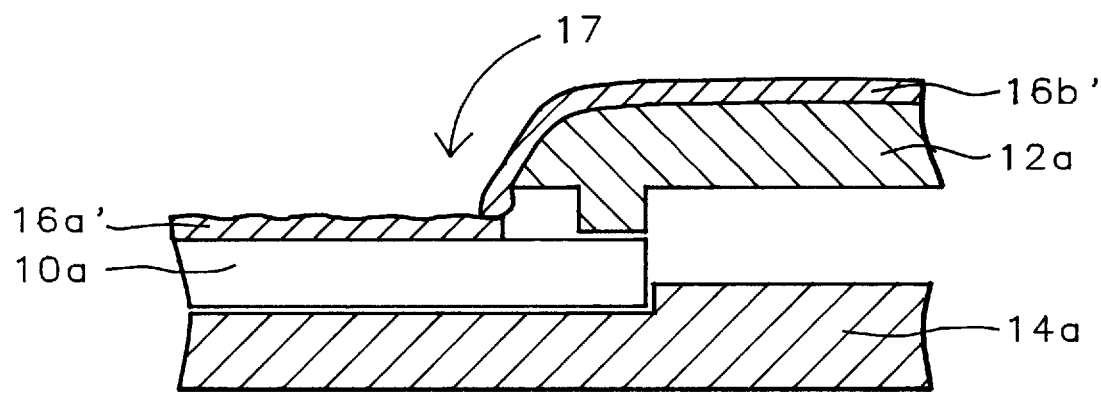
FIG. 4 – Prior Art
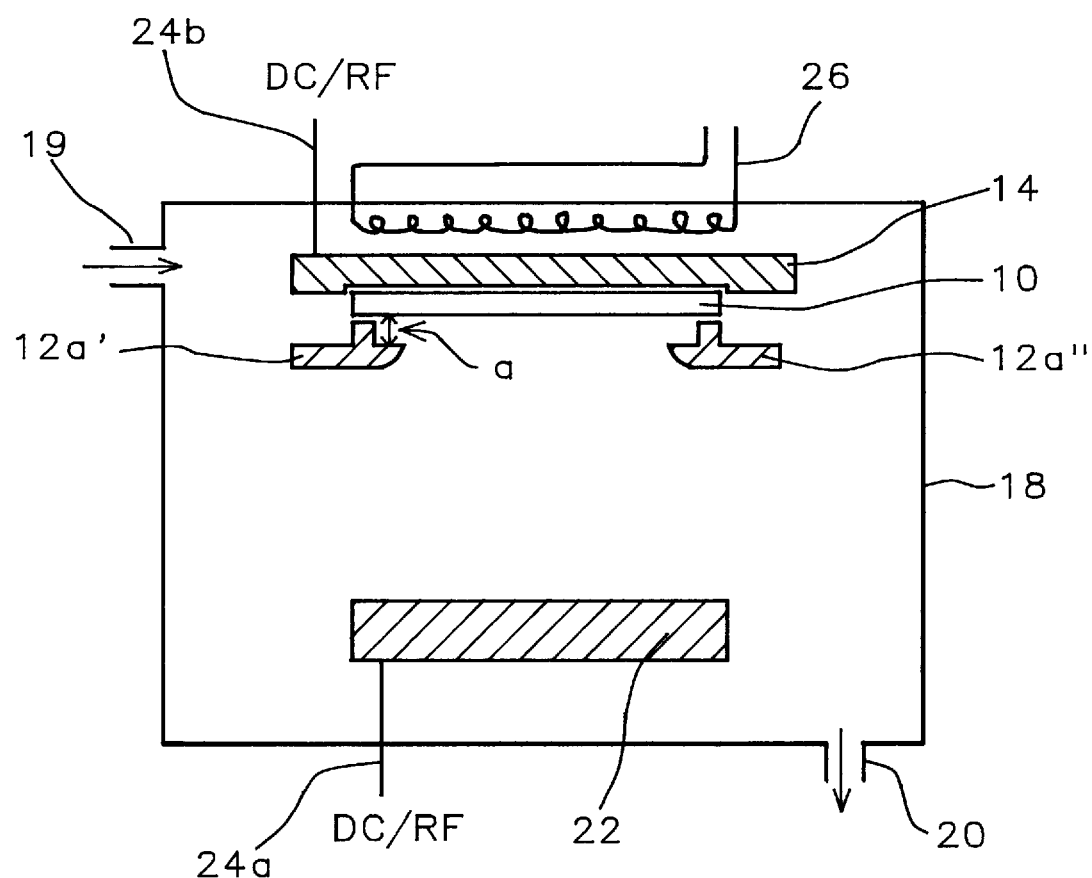
FIG. 5

METHOD FOR MINIMIZING SUBSTRATE TO CLAMP STICKING DURING THERMAL PROCESSING OF THERMALLY FLOWABLE LAYERS

BACKGROUND OF THE INVENTION

1. Field of the Invention

The present invention relates generally to methods for forming thermally flowable layers upon substrates. More particularly, the present invention relates to a method for minimizing substrate to substrate clamp sticking during thermal processing of a thermally flowable layer formed upon a substrate clamped within the substrate clamp.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by dielectric layers.

Patterned conductor layers for use within integrated circuits are typically formed through patterning through etching methods as are conventional in the art of blanket conductor layers formed upon semiconductor substrates. Most commonly, blanket conductor layers are formed upon semiconductor substrates from low melting temperature metal containing conductor layers formed of low melting temperature conductor metals such as but not limited to aluminum, aluminum alloys, aluminum-silicon alloys, aluminum-copper alloys and aluminum-silicon-copper alloys. Blanket low melting temperature metal containing conductor layers, such as blanket aluminum containing conductor layers, may be formed upon semiconductor substrates through several methods as are conventional in the art, including but not limited to thermally assisted evaporation methods, electron beam assisted evaporation methods and physical vapor deposition (PVD) sputtering methods.

In many of the several methods for forming a blanket low melting temperature metal containing conductor layer, such as a blanket aluminum containing conductor layer, upon a substrate, such as a semiconductor substrate, it is common in the art to employ a substrate clamp which among other functions serves as a fixture for properly positioning the substrate within a blanket low melting temperature metal containing conductor layer deposition tool, such as a blanket aluminum containing conductor layer deposition tool, when forming the blanket low melting temperature metal containing conductor layer, such as the blanket aluminum containing conductor layer, upon the substrate. A schematic plan-view diagram of a substrate clamped within a typical substrate clamp is shown in FIG. 1. Shown in FIG. 1 is a substrate 10 positioned beneath a top member 12 of a substrate clamp. Although FIG. 1 illustrates the top member 12 of the substrate clamp as a circular ring, a substrate clamp having a top member formed with an alternate geometric configuration to accommodate a substrate similarly formed with an alternate geometric configuration is not precluded for use within blanket low melting temperature metal containing conductor layer deposition tooling.

In accord with the cross-section 2—2 as illustrated in FIG. 1, FIG. 2 shows a schematic cross-sectional diagram of a portion of the substrate 10 clamped within the substrate clamp as illustrated in FIG. 1. As shown in FIG. 2, the substrate 10a is positioned within the substrate clamp between the top member 12a of the substrate clamp and a backing member 14a of the substrate clamp. The top member 12a and the backing member 14a are connected through a mechanical means (not shown) otherwise conventional in the art of substrate clamp design and fabrication. Although FIG. 2 illustrates the backing member 14a as a backing plate, a substrate clamp having a backing member formed with an alternate geometric configuration is also not precluded for use within blanket low melting temperature metal containing conductor layer deposition tooling.

While the use of substrate clamps as a means for fixturing substrates within blanket low melting temperature metal containing conductor layer deposition tooling, such as blanket aluminum containing conductor layer deposition tooling, has become quite common in the art of blanket low melting temperature metal containing conductor layer deposition, the use of substrate clamps for fixturing substrates within blanket low melting temperature metal containing conductor layer deposition tooling is not entirely without problems. In particular, it is known in the art that when substrate clamps, such as the substrate clamp whose schematic cross-sectional diagram is illustrated in FIG. 2, are employed as fixtures within blanket low melting temperature metal containing conductor layer deposition tooling and methods, such as blanket aluminum containing conductor layer deposition tooling and methods, there is observed a sticking of a substrate to the top member of the substrate clamp when a blanket low melting temperature metal containing conductor layer, such as a blanket aluminum containing conductor layer, formed upon the substrate clamped within the substrate clamp is thermally processed at elevated temperature (typically in excess of about 350 degrees centigrade for aluminum containing conductor layers, at which temperature aluminum containing conductor alloys typically flow) to form a thermally processed blanket low melting temperature metal containing conductor layer, such as a thermally processed blanket aluminum containing conductor layer. Such sticking of the substrate to the top member of the substrate clamp is undesirable since it is often difficult to remove such a substrate when stuck to the top member of the substrate clamp without damaging either the blanket thermally processed low melting temperature metal containing conductor layer or the substrate. The physical mechanism through which such sticking occurs is illustrated by reference to the schematic cross-sectional diagrams of FIG. 3 and FIG. 4.

Shown n FIG. 3 is a schematic cross-sectional diagram otherwise equivalent to the schematic cross-sectional diagram of the substrate 10a clamped between the top member 12a and the backing member 14a of the substrate clamp as illustrated in FIG. 2, but where there is formed upon the substrate 10a blanket low melting temperature metal containing conductor layer 16a and where there is also formed upon the top member 12a of the substrate clamp a low melting temperature metal containing conductor layer residue 16b. The blanket low melting temperature metal containing conductor layer 16a and the low melting temperature metal containing conductor layer residue 16b are typically formed simultaneously within most blanket low melting temperature metal containing conductor layer deposition tools and methods since most blanket low melting temperature metal containing conductor layer deposition tools and methods, such as blanket aluminum containing conductor layer deposition tools and methods, provide line-of-sight deposition characteristics. For the same reason, the blanket low melting temperature metal containing conductor layer 16a is not formed upon the portion of the substrate 10a shaded by the top member 12a of the substrate clamp.

Shown in FIG. 4 is the results of further processing of the blanket low melting temperature metal containing conductor layer 16a formed upon the substrate 10a as illustrated in FIG. 3. Shown in FIG. 4 is the results of thermal processing of the blanket low melting temperature metal containing conductor layer 16a formed upon the substrate 10a as illustrated in FIG. 3. As is seen within FIG. 4, the low melting temperature metal containing conductor layer residue 16b, when thermally processed simultaneously with the blanket low melting temperature metal containing conductor layer 16a, flows to form the thermally processed low melting temperature metal containing conductor layer residue 16b' which bridges to the thermally processed blanket low melting temperature metal containing conductor layer 16a' by virtue of flow of the thermally processed low melting temperature metal containing conductor layer residue 16b', as indicated by the arrow 17 in FIG. 4.

It is thus towards the goal of eliminating substrate to top member of substrate clamp sticking through a physical mechanism involving flow of a thermally processed low melting temperature metal containing conductor layer residue, such as the thermally processed low melting temperature metal containing conductor layer residue 16b' as illustrated in FIG. 4, that the present invention is specifically directed.

Various aspects of blanket integrated circuit layer deposition tooling and methods, such as blanket low melting temperature metal containing conductor layer deposition tooling and methods, and in particular blanket aluminum containing conductor layer deposition tooling and methods, have been disclosed in the art. For example, Wolf et al., in Silicon Processing for the VLSI Era, Vol. 1—Process Technology, Lattice Press (Sunset Beach, Calif.: 1986), pp. 359–63 disclose several detail of the design and construction of sputter systems employed in depositing various metal layers within integrated circuits. In addition, Parsons et al., in U.S. Pat. No. 4,486,289 disclose for depositing integrated circuit layers within integrated circuits a compact planar magnetron sputtering apparatus with improved magnetic coupling to the cathode of the planar magnetron sputtering apparatus. Further, Dimock et al., in U.S. Pat. No. 4,522,697 and Dimock, in U.S. Pat. No. 0.4,523,985 disclose a method and apparatus for indexing substrate wafers to be transferred from a conventional substrate wafer carrier to a substrate wafer processing apparatus wherein integrated circuit layers may be formed upon the substrate wafers. Yet further, Davis et al., in U.S. Pat. No. 4,836,905 discloses a substrate wafer processing method and apparatus where a substrate wafer when in a face down position within a reactor chamber is exposed to first processing step, preferably a plasma cleaning process step, while the substrate wafer when subsequently moved to a vertical position within the reactor chamber is then exposed to a second processing step, preferably a sputter deposition process step. Through the method and apparatus there is avoided particulate contamination accumulation upon the substrate wafer.

Finally: (1) Ono et al., in "Development of a Planarized Al-Si Contact Filling Technology," 1990 VMIC Conference Proceedings (Jun. 12–13, 1990), pp. 76–82; (2) Chen et al., in "Planarized Aluminum Metallization for Sub-0.5 µm CMOS Technology," IEEE IEDM 90, pp. 90–51 to 90–53; and (3) Park et al., in "Al-PLAPH (ALuminum PLAnarization by Post Heating) Process for Planarized Double Metal CMOS Applications," 1991 VMIC Conference Proceedings (Jun. 11–12, 1991), pp. 326–28, disclose various methods for forming within integrated circuits blanket aluminum containing conductor layers exhibiting sub-micron contacts to substrates or sub-micron via filling properties.

Desirable in the art are methods, materials and/or designs through which substrate clamps employed as fixtures when forming and thermally processing blanket low melting temperature metal containing conductor layers upon substrates clamped within those substrate clamps may be fabricated and/or employed in a fashion such that the substrates do not stick to the substrate clamps. Particularly desirable are methods, materials and/or designs through which substrate clamps employed as fixtures when forming and thermally processing blanket aluminum containing conductor layers upon semiconductor substrates clamped within those substrate clamps may be fabricated and/or employed in a fashion such that the semiconductor substrates do not stick to substrate clamps. It is towards the foregoing goals that the present invention is generally directed.

SUMMARY OF THE INVENTION

A first object of the present invention is to provide a method for avoiding sticking of a substrate to a substrate clamp when forming and thermally processing a blanket low melting temperature metal containing conductor layer upon the substrate clamped within the substrate clamp.

A second object of the present invention is to provide a method in accord with the first object of the present invention, where the blanket low melting temperature metal containing conductor layer is formed from an aluminum containing conductor material.

A third object of the present invention is to provide a method in accord with the first object of the present invention and the second object of the present invention, which method is readily manufactureable.

In accord with the objects of the present invention there is provided by the present invention a method for forming and thermally processing upon a substrate clamped within a substrate clamp a blanket low melting temperature metal containing conductor layer. To practice the method of the present invention, there is first provided a substrate. The substrate is fixtured within a clamp, where the clamp comprises a backing member and a top member connected through a mechanical means to the backing member. The backing member and the top member are sized such that the substrate may be clamped between the backing member and the top member. A portion of the top member overlaps the substrate and leaves exposed a first portion of the substrate when the substrate is clamped between the backing member and the top member. There is then formed upon the first portion of the substrate a low melting temperature metal containing conductor layer while simultaneously forming upon the top member of the clamp a low melting temperature metal containing conductor layer residue. There is then processed thermally the low melting temperature metal containing conductor layer and the low melting temperature metal containing conductor layer residue while positioning the substrate within the clamp in a substantially face down position, whereby a thermally processed low melting temperature metal containing conductor layer residue formed from the low melting temperature metal containing conductor layer residue will not flow and bridge with a thermally processed low melting temperature metal containing conductor layer formed from the low melting temperature metal containing conductor layer.

The method of the present invention contemplates that the method of the present invention may be employment in forming and thermally processing upon substrates thermally flowable layers other than blanket low melting temperature metal containing conductor layers. In addition, the method of the present invention also contemplates at least one apparatus within which may be practiced the method of the present invention.

Through the method of the present invention there is avoided sticking of a substrate to a substrate lamp when forming and thermally processing a blanket low melting temperature metal containing conductor layer upon the substrate clamped within the substrate clamp. The method of the present invention achieves this goal through maintaining the substrate within the substrate clamp in a substantially face down position when thermally processing the blanket low melting temperature metal containing conductor layer formed upon the substrate clamped within the substrate clamp. Through maintaining the substrate clamped within the substrate clamp in a substantially face down position when thermally processing the blanket low melting temperature metal containing conductor layer formed upon the substrate clamped within the substrate clamp, there is avoided bridging of: (1) a thermally processed low melting temperature metal containing conductor layer residue formed from a low melting temperature metal containing conductor layer residue formed upon the top member of the substrate clamp; with (2) a thermally processed blanket low melting temperature metal containing conductor layer formed from a blanket low melting temperature metal containing conductor layer formed upon the substrate.

The method of the present invention may be employed when the blanket low melting temperature metal containing conductor layer is formed from an aluminum containing conductor material. The method of the present invention does not discriminate with respect to the nature of the material from which is formed the blanket low melting temperature metal containing conductor layer provided that the material from which is formed the blanket low melting temperature metal containing conductor layer is susceptible to flow and bridging between the blanket low melting temperature metal containing conductor layer and a low melting temperature metal containing conductor layer residue when forming and thermally processing upon the substrate the blanket low melting temperature metal containing conductor layer. Thus, the blanket low melting temperature metal containing conductor layer may be formed of an aluminum containing conductor material, or any other thermally flowable material which need not necessarily be a low melting temperature metal containing conductor material.

The method of the present invention is readily manufacturable. The method of the present invention relies upon thermally processing a blanket low melting temperature metal containing conductor layer formed upon a substrate clamped within a substrate clamp, where the substrate clamped within the substrate clamp is positioned in a substantially face down position when thermally processed. An apparatus through which such positioning of the substrate clamped within the substrate clamp may be accomplished is illustrated within the Description of the Preferred Embodiment as is readily constructed. Thus, the method of the present invention is readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 1 shows a schematic plan-view diagram of a substrate clamped within a substrate clamp conventional in the art of substrate clamp design and fabrication.

FIG. 2 shows a schematic cross-sectional diagram illustrating a portion of the substrate clamped within a portion of the substrate clamp as illustrated in FIG. 1.

FIG. 3 and FIG. 4 show a pair of schematic cross-sectional diagrams illustrating the results of progressive stages in forming and thermally processing a blanket low melting temperature metal containing conductor layer upon the substrate clamped within the substrate clamp whose schematic cross-sectional diagram is illustrated in FIG. 2.

FIG. 5 and FIG. 6 show a pair of schematic cross-sectional diagrams illustrating the results of progressive stages in forming and thermally processing upon a substrate clamped within a substrate clamp a blanket low melting temperature metal containing conductor layer through the preferred embodiment of the method of the present invention.

DESCRIPTION OF THE PREFERRED EMBODIMENT

Figure 6:
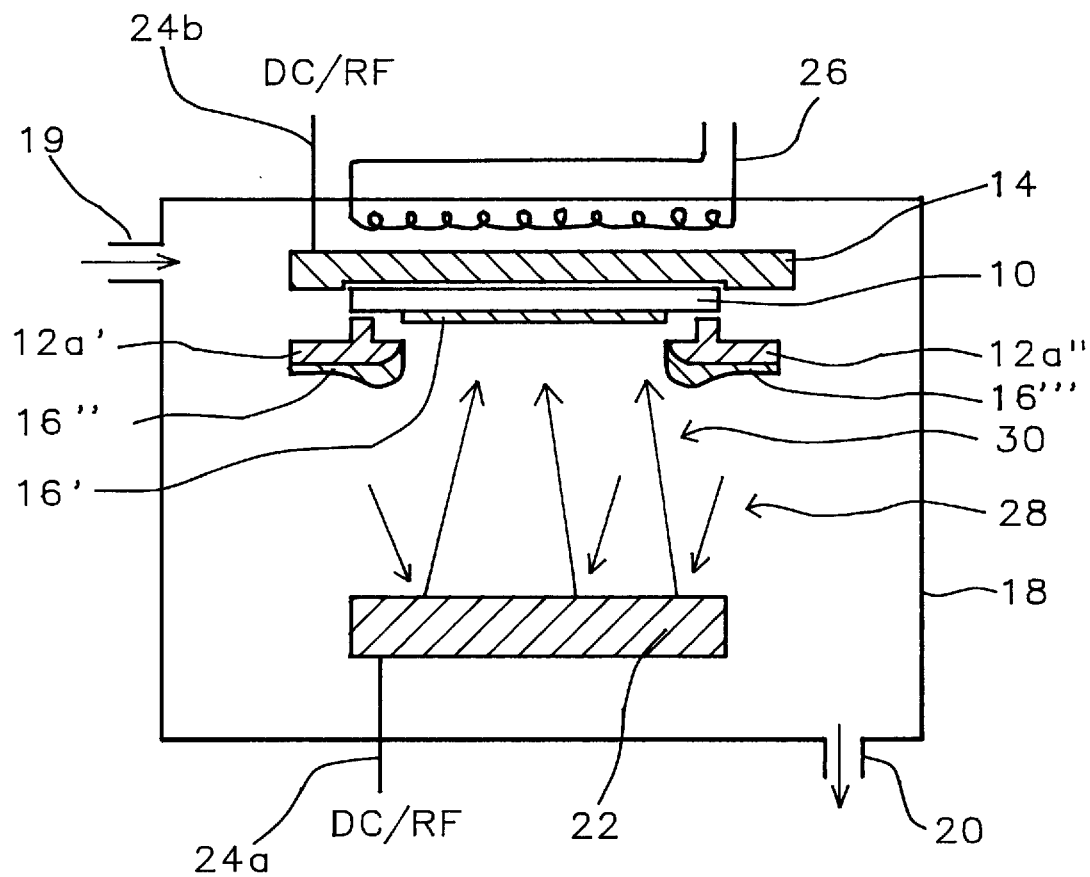

The present invention provides a method for forming and thermally processing upon a substrate clamped within a substrate clamp a blanket low melting temperature metal containing conductor layer, where the substrate clamped within the substrate clamp does not stick to the substrate clamp due to flow and bridging of a low melting temperature metal containing conductor layer residue formed upon a top member of the substrate clamp when the blanket low melting temperature metal containing conductor layer is formed and thermally processed upon the substrate. The method of the present invention achieves this goal through positioning the substrate clamped within the substrate clamp in a substantially face down position when the blanket low melting temperature metal containing conductor layer formed upon the substrate and the low melting temperature metal containing conductor layer residue formed upon the top member of the clamp are simultaneously thermally processed to form a thermally processed blanket low melting temperature metal containing conductor layer and a thermally processed low melting temperature metal containing conductor layer residue.

Although the preferred embodiment of the method of the present invention employs the substrate clamp of the present invention when simultaneously forming and thermally processing through a thermal physical vapor deposition (PVD) sputtering method a blanket aluminum containing conductor layer upon a semiconductor integrated circuit substrate clamped within the substrate clamp, the method of the present invention may be employed when forming a blanket aluminum containing conductor layer, or other blanket low melting temperature metal containing conductor layer, upon a substrate other than a semiconductor integrated circuit substrate through methods other than thermal physical vapor deposition (PVD) sputtering methods. Such other substrates include but are not limited to semiconductor substrates employed in forming solar cells, ceramic substrates employed in multi-layer ceramic (MLC) packaging of integrated circuits, glass substrates employed within thin film transistors/liquid crystal displays, gallium arsenide substrates, silicon on insulator (SOI) substrates and silicon on sapphire (SOS) substrates. Additional descriptions of silicon on insulator (SOI) substrates and silicon on sapphire (SOS) substrates are provided by S. M. Sze in VLSI Technology, 2nd Edition, McGraw-Hill (New York: 1988), at pp. 85–89.

With respect to low melting temperature metal containing conductor materials from which may be formed and thermally processed blanket low melting temperature metal containing conductor layers through the method of the present invention, there may in addition to the preferred aluminum containing conductor materials, such as but not limited to aluminum, aluminum alloys, aluminum-silicon alloys, aluminum-copper alloys, and aluminum-silicon-copper alloys also be formed and thermally processed through the method of the present invention other blanket low melting temperature metal containing conductor layers formed of other low melting temperature metal containing conductor materials including but not limited to lead, lead alloys, tin, tin alloys, antimony, antimony alloys, indium and indium alloys. Preferably, the blanket low melting temperature metal containing conductor layer, whether formed from an aluminum containing conductor material or an other low melting temperature metal containing conductor material, has a melting temperature less than about 800 degrees centigrade.

Finally, as is understood by a person skilled in the art, the method of the present invention may also be employed when forming upon a substrate clamped within a substrate clamp a blanket thermally flowable layer other than a blanket low melting temperature metal containing conductor layer, while avoiding sticking of the substrate to the substrate clamp. Such a blanket thermally flowable layer other than a blanket low melting temperature metal containing conductor layer may be formed from a thermally flowable material selected from the group including but not limited to organic polymer materials, inorganic polymer materials, hybrid polymer materials and glasses, which may be formed and thermally annealed upon substrates through methods including but not limited to thermally assisted evaporation methods, chemical vapor deposition (CVD) methods, physical vapor deposition (PVD) sputtering methods and in-situ vapor phase polymerization methods, typically at temperatures no greater than the temperatures employed in forming or thermally annealing blanket low melting temperature metal containing conductor layers upon substrates.

Referring now to FIG. 5 and FIG. 6 there is shown a pair of schematic cross-sectional diagrams illustrating the results of progressive stages in forming and thermally processing upon a substrate clamped within a substrate clamp a blanket low melting temperature metal containing conductor layer through the preferred embodiment of the method of the present invention. The preferred embodiment of the method of the present invention employs a thermal physical vapor deposition (PVD) sputtering method in forming and thermally processing upon the substrate clamped within the substrate clamp the blanket low melting temperature metal containing conductor layer. Within the preferred embodiment of the method of the present invention, the blanket low melting temperature metal containing conductor layer is preferably a blanket aluminum containing conductor layer and the substrate is preferably a semiconductor substrate employed in forming integrated circuits.

Shown in FIG. 5 is a reactor chamber 18 having positioned therein, in a substantially face down position, the substrate 10 clamped between the backing member 14 and the top members 12a' and 12a" of the substrate clamp. The substrate 10, the backing member 14 and the top members 12a' and 12a" of the substrate clamp, are otherwise conventional in the art of substrate clamps and substrates employed within integrated circuit fabrication. For the purposes of the present invention, the substrate 10 within the substrate clamp is positioned in a substantially face down position, if, when there is formed and thermally processed upon the top members 12a' and 12a" of the substrate clamp thermally processed low melting temperature metal containing conductor layer residues, the thermally processed low melting temperature metal containing conductor layer residues do not flow and bridge to a thermally processed low melting temperature metal containing conductor layer simultaneously formed and thermally processed upon the substrate 10 clamped within the substrate clamp. While the preferred embodiment of the method of the present invention may employ a substrate clamp of any of several dimensions to accommodate the substrate 10 similarly formed of any of several dimensions, preferably a top member elevation clearance "a" as illustrated in FIG. 5 is at least 5 times the thickness of a blanket low melting temperature metal containing conductor layer desired to be formed and thermally processed upon the substrate 10 clamped within the substrate clamp. In the absence of a sufficient top member elevation clearance "a", the substrate 10 may stick to the top member 12a' or the top member 12a" when forming and thermally processing a blanket low melting temperature metal containing conductor layer upon the substrate 10, for reasons independent of the advantages and features provided by the method of the present invention.

In addition to the various dimensions which may be employed in forming the substrate clamp employed within the preferred embodiment of the method of the present invention, the substrate clamp employed within the preferred embodiment of the method of the present invention may also be fabricated from any of several materials. Preferably, the substrate clamp of the present invention is fabricated from materials which are unaffected by the temperature at which a blanket low melting temperature metal containing conductor layer formed upon the substrate 10 clamped within the substrate clamp is thermally processed. Similarly, the substrate clamp of the present invention is preferably also fabricated from materials from which there may readily be removed thermally processed low melting temperature metal containing conductor layer residues formed upon the top member 12a' or the top member 12a" of the substrate clamp. Materials which fulfill these characteristics include but are not limited to stainless steel, titanium, tantalum and ceramics.

Although not specifically illustrated by the schematic cross-sectional diagram of FIG. 5, the top members 12a' and 12a" of the substrate clamp employed within the preferred embodiment of the method of the present invention are connected mechanically to the backing member 14 through mechanical means as are conventional in the art of substrate clamp design and fabrication, such mechanical means including but not limited to hinges, cams, lobes and fasteners. Preferably, the mechanical means for connecting the top members 12a' and 12a" with the backing member 14 will include a minimal number of parts which may generate particulate when connecting the top members 12a' and 12a" of the substrate clamp with the backing member 14.

Also shown in FIG. 5 within the reactor chamber 18 is a target 22 formed of a low melting temperature metal containing conductor material from which it is desired to form a low melting temperature metal containing conductor layer upon the substrate 10. While the target may be formed of any low melting temperature metal containing conductor layer, including but not limited to aluminum, aluminum alloys, aluminum-silicon alloys, aluminum-copper alloys, aluminum-silicon-copper alloys, tin, tin alloys, lead, lead alloys, antimony, antimony alloys, indium and indium alloys, the low melting temperature metal containing conductor material from which is formed the target 22 is preferably an aluminum-silicon-copper alloy of weight ratio from about 100:2:0.1 to about 100:10:5. Similarly, there is also shown within the reactor chamber 18 as illustrated in FIG. 5 a heater 26 for heating the substrate 10 within the substrate clamp simultaneously with or subsequent to forming through the physical vapor deposition (PVD) sputtering method the blanket low melting temperature metal containing conductor layer upon the substrate 10. Although the heater 26 may employ any type of heating means, including but not limited to resistive heating means and radiative heating means, for the preferred embodiment of the method of the present invention, the heater 26 preferably employs a resistive heating means.

Also shown in FIG. 5 are an inlet port 19 of the reactor chamber 18 and an outlet port 20 of the reactor chamber 18. The inlet port 19 and the outlet port 20 provide a means for introducing and exhausting from the reactor chamber 18 a sputtering gas employed in forming upon the substrate 10 a blanket low melting temperature metal containing conductor layer. Although any of several sputtering gases may be introduced into the reactor chamber 18 to assist in sputtering the target 22 to form the blanket low melting temperature metal containing conductor layer upon the substrate 10, including but not limited to reactive sputtering gases and non-reactive sputtering gases, for the preferred embodiment of the method of the present invention, the sputtering gas is preferably a non-reactive sputtering gas, preferably a non-reactive argon sputtering gas.

Finally, there is shown in FIG. 5 the presence of a first sputtering electrode 24a which is connected to the target 22 and a second sputtering electrode 24b which is connected to the substrate clamp. Typically, although not exclusively, the substrate clamp will be connected through the second sputtering electrode 24b to an electrical ground, while the target 22 will be connected through the first sputtering electrode 24a to a power source, such as but not limited to a radio frequency power source or a direct current power source, in order to provide an appropriate potential difference between the target 22 and the substrate 10 to facilitate the physical vapor deposition (PVD) sputtering reaction through which is formed the blanket low melting temperature metal containing conductor layer upon the substrate 10.

Referring now to FIG. 6 there is shown the results of further processing of the substrate 10 within the substrate clamp as illustrated in FIG. 5. Shown in FIG. 6 is the results of forming and thermally processing through the thermal physical vapor deposition (PVD) sputtering method a thermally processed blanket low melting temperature metal containing conductor layer 16' upon the substrate 10. As is shown in FIG. 6, the trajectories of the argon sputtering ions 28 dislodge clusters of the target 22 yielding clusters of the target 22 material having trajectories of the sputtered target material 30 directed towards the substrate 10. As is also illustrated in FIG. 6, a pair of thermally processed low melting temperature metal containing conductor layer residues 16" and 16'" formed upon the top members 12a' and 12a" of the substrate clamp do not flow and bridge to the thermally processed low melting temperature metal containing conductor layer 16'. The absence of bridging of the thermally processed low melting temperature metal containing conductor layer residues 16" and 16'" with the thermally processed blanket low melting temperature metal containing conductor layer 16' results from the positioning of the substate 10 within the substrate clamp in a substantially face down position, in conjunction with the effects of gravity. Preferably the thickness of the thermally processed blanket low melting temperature metal containing conductor layer 16' is from about 250 to about 20000 angstroms. Process conditions employed in simultaneously forming and thermally processing the thermally processed blanket low melting temperature metal containing conductor layer 16' and the thermally processed low melting temperature metal containing conductor layer residues 16" and 16'", as illustrated in FIG. 6, preferably include: (1) a reactor chamber pressure of from about 10E-9 to about 10E2 mtorr; (2) a radio frequency sputtering power of from about 2 to about 80 watts at a radio frequency of 13.56 MHZ; (3) an argon sputtering gas flow rate of from about 1 to about 200 standard cubic centimeters per minute (sccm); and (4) a substrate temperature of from about 25 to about 700 degrees centigrade.

Although FIG. 6 illustrates the formation and thermal processing of the thermally processed blanket low melting temperature metal containing conductor layer 16' as a simultaneous process, it is feasible that the thermally processed blanket low melting temperature metal containing conductor layer 16' may be formed through a sequential two step process where a blanket low melting temperature metal containing conductor layer is formed upon the substrate and independently subsequently thermally processed to form the thermally processed blanket low melting temperature metal containing conductor layer 16'. Under such circumstances only the thermal processing sleep when forming and thermally processing the thermally processed blanket low melting temperature metal containing conductor layer 16' need be undertaken with the substrate 10 within the substrate clamp positioned in a substantially face down position. The processing step for forming the blanket low melting temperature metal containing conductor layer may be undertaken with the substrate positioned in other than a substantially face down position.

As is understood by a person skilled in the art, the preferred embodiment of the method of the present invention is illustrative of the method of the present invention rather than limiting of the method of the present invention. Revisions and modifications may be made to materials, structures and dimensions through which is practiced the preferred embodiment of the method of the present invention while still providing a method which is within the spirit and scope of the present invention, as defined by the accompanying claims.

What is claimed is:

1. A method for forming and thermally processing upon a substrate a thermally flowable layer comprising:

providing a substrate;

fixturing the substrate within a clamp, the clamp comprising:
    a backing member; and
    a top member connected through a mechanical means to the backing member, the backing member and the top member being sized such that the substrate may be clamped between the backing member and the top member, a portion of the top member overlapping the substrate and leaving exposed a first portion of the substrate when the substrate is clamped between the backing member and the top member;

forming upon the first portion of the substrate a thermally flowable layer while simultaneously forming upon the top member of the clamp a thermally flowable layer residue, the thermally flowable layer and the thermally flowable layer residue being formed when the substrate and the clamp are positioned in other than a substantially face down position; and processing thermally the thermally flowable layer and the thermally flowable layer residue whereby positioning the substrate and the clamp in the substantially face down position, wherein a thermally processed thermally flowable layer residue formed from the thermally flowable layer residue will not flow and bridge with a thermally processed thermally flowable layer formed from the thermally flowable layer.

2. The method of claim 1 wherein the substrate is chosen from the group of substrates consisting of semiconductor substrates, ceramic substrates, glass substrates, gallium arsenide substrates, silicon on insulator (SOI) substrates and silicon on sapphire (SOS) substrates.

3. The method of claim 1 wherein the thermally flowable layer and the thermally flowable layer residue are formed from a thermally flowable material chosen from the group consisting of organic polymer materials, inorganic polymer materials, hybrid polymer materials, glasses and low melting temperature metals.

4. A method for forming and thermally processing upon a substrate a low melting temperature metal containing conductor layer comprising:

providing a substrate;

fixturing the substrate within a clamp, the clamp comprising:
 a backing member; and
 a top member connected through a mechanical means to the backing member, the backing member and the top member being sized such that the substrate may be clamped between the backing member and the top member, a portion of the top member overlapping the substrate and leaving exposed a first portion of the substrate when the substrate is clamped between the backing member and the top member;

forming upon the first portion of the substrate a low melting temperature metal containing conductor layer while simultaneously forming upon the top member of the clamp a low melting temperature metal containing conductor layer residue, the low melting temperature metal containing conductor layer and the low melting temperature metal containing conductor layer residue being formed when the substrate and the clamp are positioned in other than a substantially face down position; and processing thermally the low melting temperature metal containing conductor layer and the low melting temperature metal containing conductor layer residue while positioning the substrate and the clamp in the substantially face down position, wherein a thermally processed low melting temperature metal containing conductor layer residue formed from the low melting temperature metal containing conductor layer residue will not flow and bridge with a thermally processed low melting temperature metal containing conductor layer formed from the low melting temperature metal containing conductor layer.

5. The method of claim 4 wherein the substrate is chosen from the group of substrates consisting of semiconductor substrates, ceramic substrates, glass substrates, gallium arsenide substrates, silicon on insulator (SOI) substrates and silicon on sapphire (SOS) substrates.

6. The method of claim 4 wherein the low melting temperature metal containing conductor layer and the low melting temperature metal containing conductor layer residue are formed from a low melting temperature metal containing conductor selected from the group consisting of aluminum, aluminum alloys, aluminum-silicon alloys, aluminum-copper alloys, aluminum-silicon-copper alloys, lead, lead alloys, tin, tin alloys, antimony, antimony alloys, indium and indium alloys.

\* \* \* \* \*